(12) United States Patent
Wang et al.

(10) Patent No.: US 9,905,581 B2
(45) Date of Patent: Feb. 27, 2018

(54) ARRAY SUBSTRATE AND DISPLAY PANEL WITH SAME

(71) Applicant: Century Technology (Shenzhen) Corporation Limited, Shenzhen (CN)

(72) Inventors: Ming-Tsung Wang, New Taipei (TW); Chih-Chung Liu, New Taipei (TW); Yi-Hsiu Cheng, New Taipei (TW); Li-Fang Wang, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 232 days.

(21) Appl. No.: 14/926,903

(22) Filed: Oct. 29, 2015

(65) Prior Publication Data

US 2017/0117297 A1     Apr. 27, 2017

(30) Foreign Application Priority Data

Oct. 23, 2015   (CN) .......................... 2015 1 0692583

(51) Int. Cl.
| | |
|---|---|
| H01L 27/12 | (2006.01) |
| G09G 3/36 | (2006.01) |
| H01L 23/522 | (2006.01) |
| H01L 23/528 | (2006.01) |

(52) U.S. Cl.
CPC ......... *H01L 27/124* (2013.01); *G09G 3/3648* (2013.01); *H01L 23/528* (2013.01); *H01L 23/5226* (2013.01); *G09G 2300/0426* (2013.01)

(58) Field of Classification Search
CPC .......... G09G 2300/0426; G09G 3/3648; H01L 23/5226; H01L 23/528; H01L 27/124
USPC ........................................................... 257/43
See application file for complete search history.

(56) References Cited

U.S. PATENT DOCUMENTS

2011/0122337 A1*  5/2011  Shimizu .............. G02F 1/13452
                                                      349/61
2015/0364396 A1* 12/2015  Asai ..................... G02F 1/13336
                                                      257/43

FOREIGN PATENT DOCUMENTS

CN            102084410 A       6/2011

* cited by examiner

*Primary Examiner* — Tony Davis
(74) *Attorney, Agent, or Firm* — ScienBiziP, P.C.

(57) ABSTRACT

An array substrate can include a plurality of thin film transistors, a plurality of function lines, a plurality of leads, a coupling part and a driver. The plurality of function lines are configured to transmit driving signals to the thin film transistors. The plurality of leads include a first lead and a second lead. The coupling part is electrically coupling the leads to the function lines. The driver is electrically coupled to the leads, and configured to provide the driving signals to the function lines. The first lead has a length larger than that of the second lead. A contacting area between the first lead and the coupling part is larger than that between the second lead and the coupling part. A display panel with the array substrate is also provided.

15 Claims, 7 Drawing Sheets

ARRAY SUBSTRATE AND DISPLAY PANEL WITH SAME

FIELD

The subject matter herein generally relates to display technology, and particularly to an array substrate and a display panel using the array substrate.

BACKGROUND

Liquid crystal display panel typically includes an array substrate, a color filter substrate, and a liquid crystal layer located between the array substrate and the color filter substrate. It is by applying voltage to control torsion of liquid crystal molecules of the liquid crystal layer to realize control of light pass rate, so as to achieve a goal of display.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to an array substrate. The array substrate can include a plurality of thin film transistors, a plurality of function lines, a plurality of leads, a coupling part and a driver. The plurality of function lines are configured to transmit driving signals to the thin film transistors. The plurality of leads include a first lead and a second lead. The coupling part is electrically coupling the leads to the function lines. The driver is electrically coupled to the leads, and configured to provide the driving signals to the function lines. The first lead has a length larger than that of the second lead. A contacting area between the first lead and the coupling part is larger than that between the second lead and the coupling part.

The present disclosure is described further in relation to a display panel. The display panel can include an array substrate, an opposite substrate and a liquid crystal layer located between the array substrate and the opposite substrate. The array substrate can include a plurality of thin film transistors, a plurality of function lines, a plurality of leads, a coupling part and a driver. The plurality of function lines are configured to transmit driving signals to the thin film transistors. The plurality of leads include a first lead and a second lead. The coupling part is electrically coupling the leads to the function lines. The driver is electrically coupled to the leads, and configured to provide the driving signals to the function lines. The first lead has a length larger than that of the second lead. A contacting area between the first lead and the coupling part is larger than that between the second lead and the coupling part.

Figure 1:
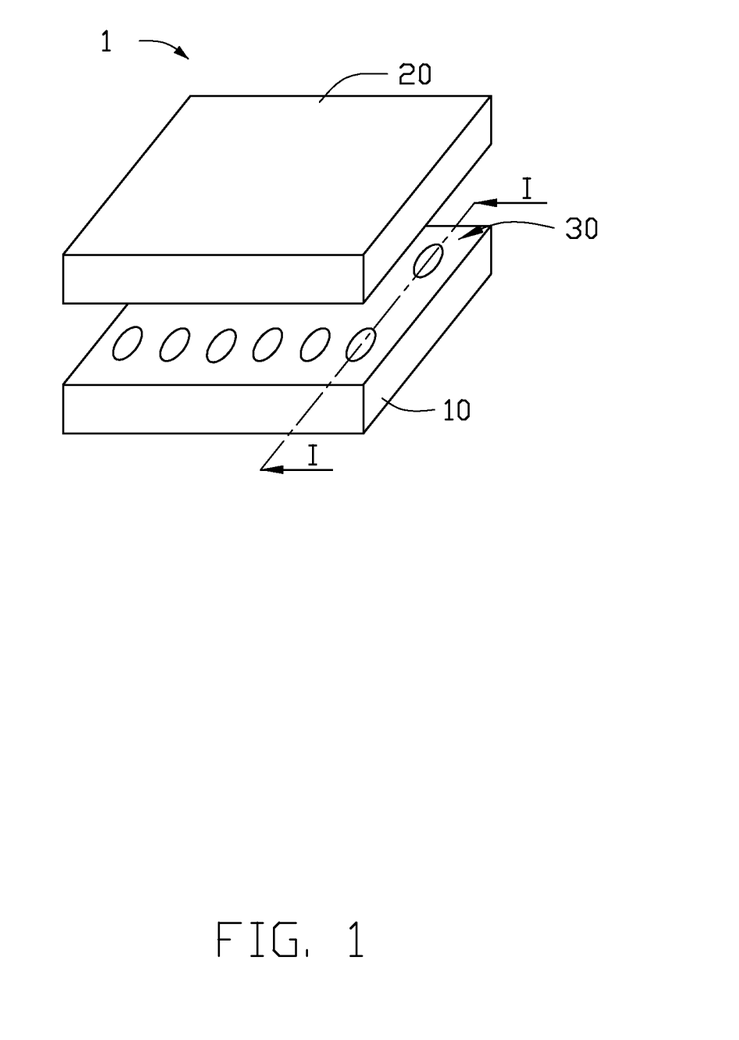
FIG. 1 is an isometric view of a display panel in accordance with an embodiment of the present disclosure.

FIG. 1 illustrates a display panel 1 of an embodiment of the present disclosure. The display panel 1 can include an array substrate 10, an opposite substrate 20, and a liquid crystal layer 30 between the array substrate 10 and the opposite substrate 20. In at least one embodiment, the opposite substrate 20 can be a colored filter-sheet substrate. The liquid crystal layer 30 includes a plurality of liquid crystal molecules. The array substrate 10 is configured to control applied voltage to control torsion of the liquid crystal molecules of the liquid crystal layer 30 to realize control of light pass rate, so as to achieve a goal of display. The opposite substrate 20 can include a plurality of light resistances of different colors. The plurality of light resistances can respectively let lights of different colors through, such as red light, green light, blue light and so on.

Figure 2:
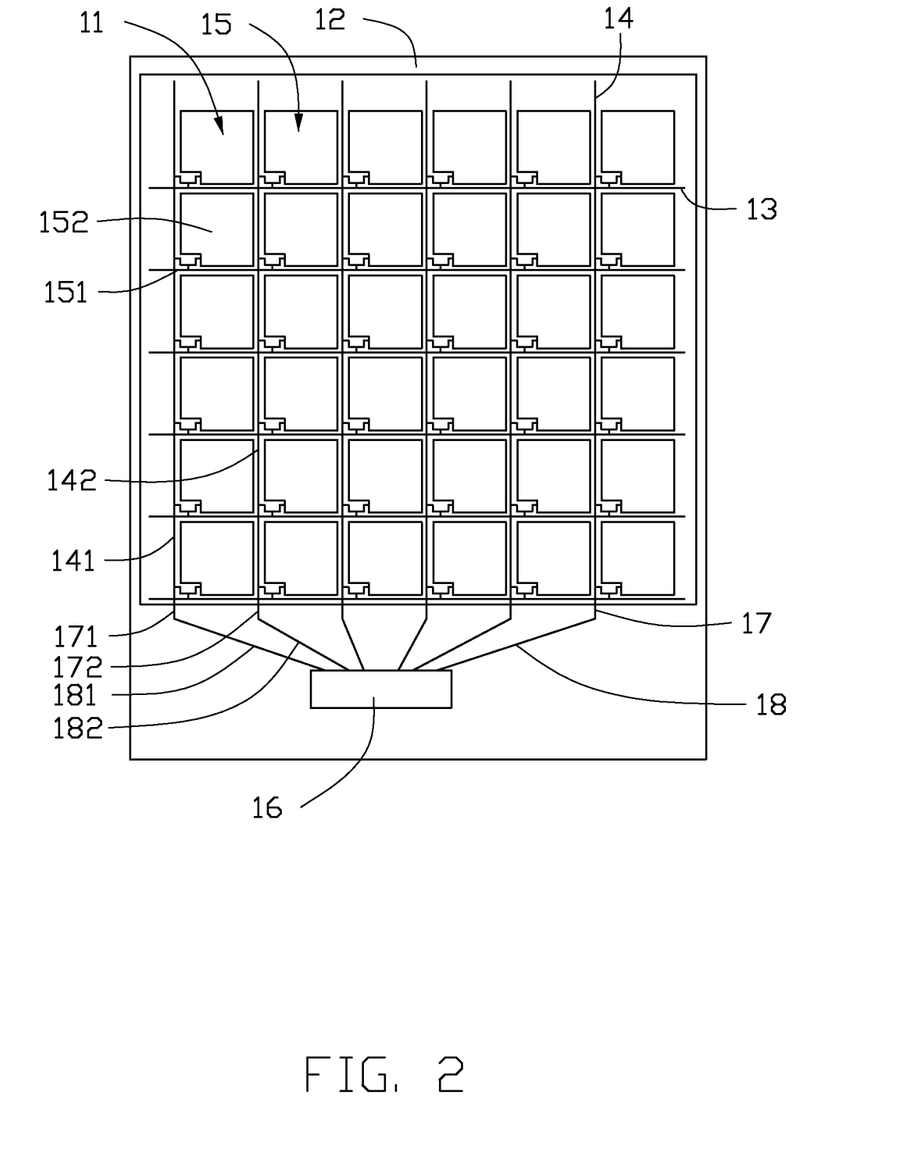
FIG. 2 is a top view of an array substrate of the display panel in FIG. 1.

FIG. 2 illustrates that the array substrate 10 can include a display area 11 and a periphery area 12 around the display area 11. The display area 11 can include a plurality of scan lines 13 and a plurality of data lines 14 cross with the scan lines 13. The plurality of scan lines 13 and the plurality of data lines 14 cooperatively form a plurality of array type pixel areas 15. The scan lines 13 and the data lines 14 are function lines of the array substrate 10 and provide electric signals to the pixel areas 15. The scan lines 13 are electrically insulated to the data lines 14.

The scan lines 13 and the data lines 14 can be made of metal materials, alloy material, metal oxide, metal nitride materials, metal oxide materials or other electrically conductive materials.

Each of the scan lines 13 can be in a configuration of a single layer or a stack layer. The stack layer can be in a configuration of molybdenum (Mo)-aluminum (Al)-molybdenum (Mo).

Each of the data lines 14 can be in a configuration of a single layer or a stack layer. The stack layer can be a in a configuration of molybdenum (Mo)-aluminum (Al)-molybdenum (Mo).

Each of the pixel areas 15 can include a thin film transistor 151 and a pixel electrode 152 electrically coupled to the thin film transistor 151. The scan lines 13 and the data lines 14 are configured to provide electric signals to the thin film transistors 151 of the pixel areas 15.

The thin film transistor 151 can be a bottom gate thin film transistor or a top gate thin film transistor. The thin film transistor 151 can include a gate electrode, a channel, a source electrode and a drain electrode. The thin film transistor 151 is electrically coupled to one scan line 13 and one data line 14.

The pixel electrode 152 is a transparent electrode. Material of the pixel electrode 152 can be indium tin oxide, indium oxide zinc or other transparent materials.

The periphery area 12 can include a driver 16, a plurality of coupling parts 17 and a plurality of leads 18. Each lead 18 has one end thereof electrically coupled to the driver 16 and another end electrically coupled to the coupling part 17. The coupling parts 17 electrically couple the function lines to the leads 18, thereby electrically coupling the driver 16 to the function lines. In at least one embodiment, the function lines are the data lines 14, the driver 16 is data driver.

In at least one embodiment, the driver 16 is adjacent to a middle portion of the array substrate 10.

The coupling parts 17 and the pixel electrodes 152 are formed by one mask etching process. Material of the coupling parts 17 is same to that of the pixel electrodes 152.

In the illustrated embodiment, the leads 18 and the scan lines 13 are formed by one mask etching process. Material of the leads 18 is same to that of the scan lines 13.

The leads 18 are arranged in a layout of sector. The lead 18 electrically coupled to the data line 14 which is remote from the driver 16 is longer than the lead 18 electrically coupled to the data line 14 which is adjacent to driver 16.

In the illustrated embodiment, the data lines 14 include a first data line 141, a second data line 142. The first data line 141 is remote from the driver 16. The second data line 142 is adjacent to the driver 16.

The leads 18 include a first lead 181 and a second lead 182. The first lead 181 can be at a periphery of the layout of sector. The second lead 182 can be at a middle of the layout of sector. The first lead 181 has a length larger than that of the second lead 182.

The coupling parts 171 can include a first coupling part 171 and a second coupling part 172.

The first data line 141 is electrically coupled to the first lead 181 via the first coupling part 171, and is further electrically coupled to the driver 16 via the first lead 181. The second data line 142 is electrically coupled to the second lead 182 via the second coupling part 172, and is further electrically coupled to the driver 16 via the second lead 182. A distance between the first data line 141 and the driver 16 is larger than a distance between the second data line 141 and the driver 16.

In at least one embodiment, the data line 14, the lead 18 and the coupling part 17 are formed by mask etching different conductive layers.

Figure 3:
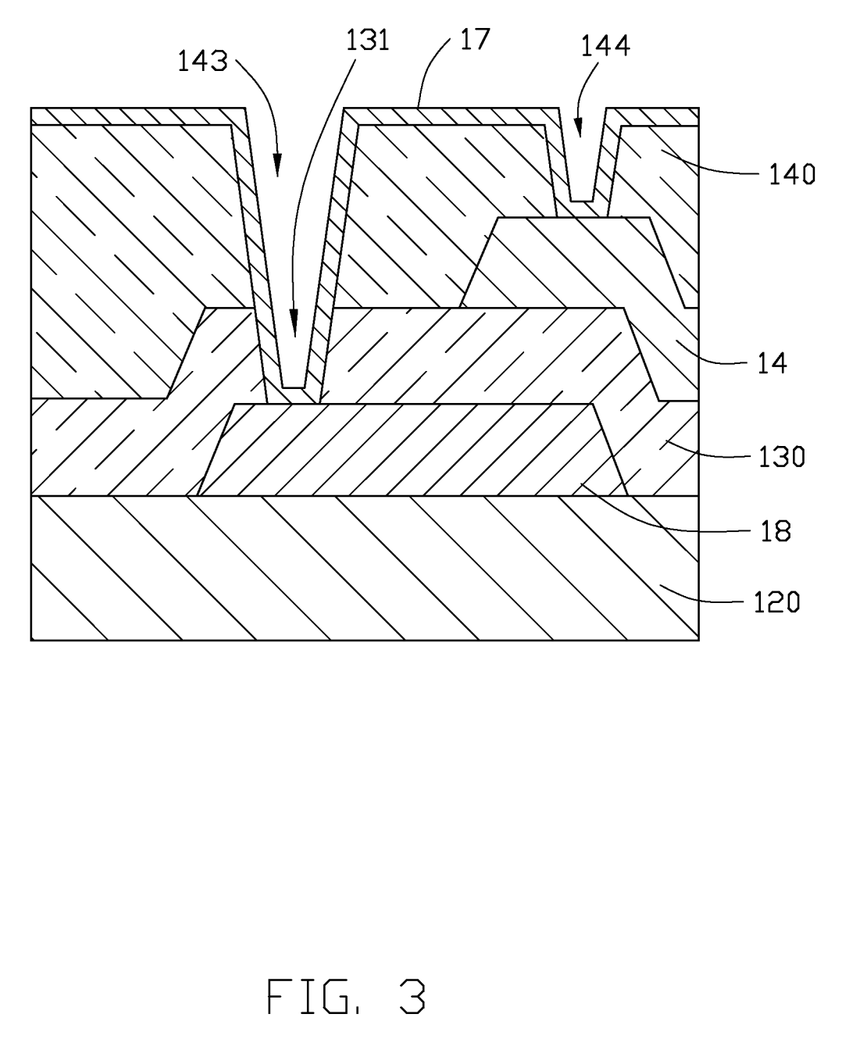
FIG. 3 is a cross sectional view of the array substrate in FIG. 1 taken along line I-I.

FIG. 3 illustrates that the array substrate 10 further includes base 120, a first insulating layer 130 and a second insulating layer 140. The lead 18 is located on the base 120. The first insulating layer 130 is located on the base 120 and covers the lead 18. The data line 14 is located on the first insulating layer 130. The second insulating layer 140 is coupled on the first insulating layer 130 and covers the data line 14. The coupling part 17 is coupled on the second insulating layer 140. The first insulating layer 130 defines a first through hole 131 corresponding to the lead 18. The second insulating layer 140 defines a second through hole 143 corresponding to the first through hole 131. The coupling part 17 has a portion thereof inserted into the first through hole 131 and the second through hole 143 and electrically coupled to the lead 18. The second insulating layer 140 defines a third through hole 144 corresponding to the data line 14. The coupling part 17 has another portion inserted into the third through hole 144 and electrically coupled to the data line 14. Therefore, the coupling part 17 electrically couples the data line 14 to the lead 18.

In the illustrated embodiment of FIG. 2, the first lead 181 has a length larger than that of the second lead 182, when the driving signals are transmitted from the driver 16 to the first data line 141 and the second data line 142, an impedance in the first data line 141 is higher than an impedance in second data line 142. In order to overcome that, a number of the first through hole 131, the second through hole 143 and the third through hole 144 where the first lead 181 is coupled to the first data line 141 via the first coupling part 171 increases, to increase coupling area between the first lead 181 and the first coupling part 171 and coupling area between the first data line 141 and the first coupling part 171. Therefore, the impedance decreases when the driving signals are transmitted from the driver 16 to the first data line 141, the impedance in the first data line 141 is substantially equal to the impedance in second data line 142 when the driving signals are transmitted from the driver 16 to the first data line 141 and the second data line 142.

Figure 4:
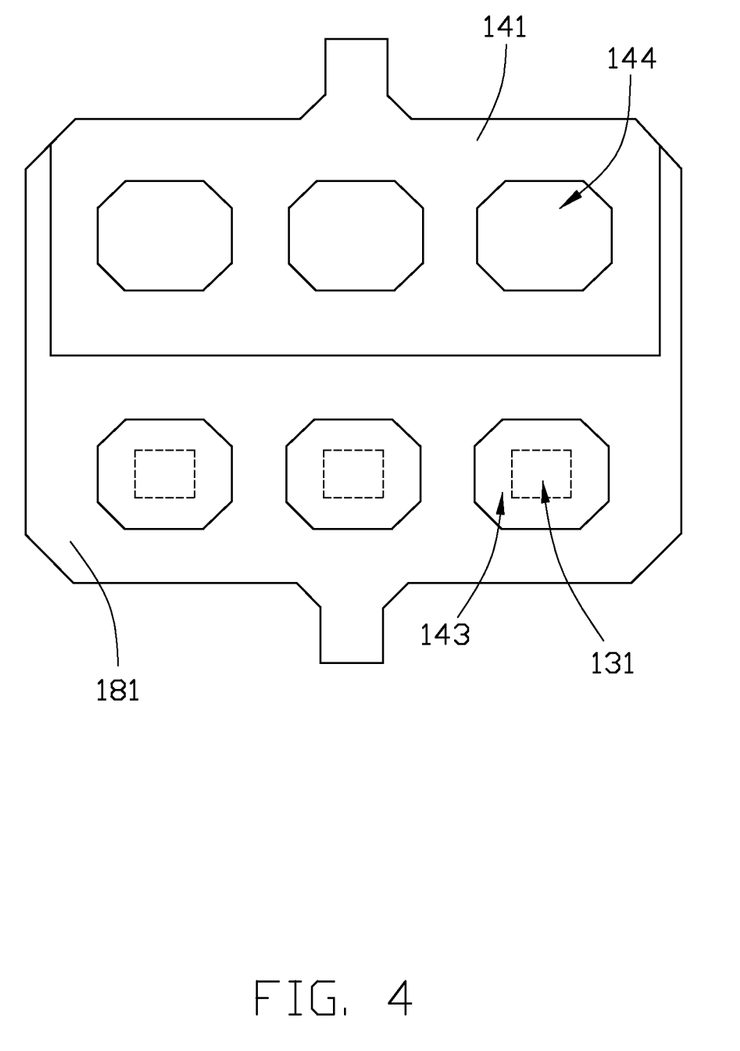
FIG. 4 is a diagrammatic, top view of a first data line and a first lead of the array substrate in FIG. 2.
Figure 5:
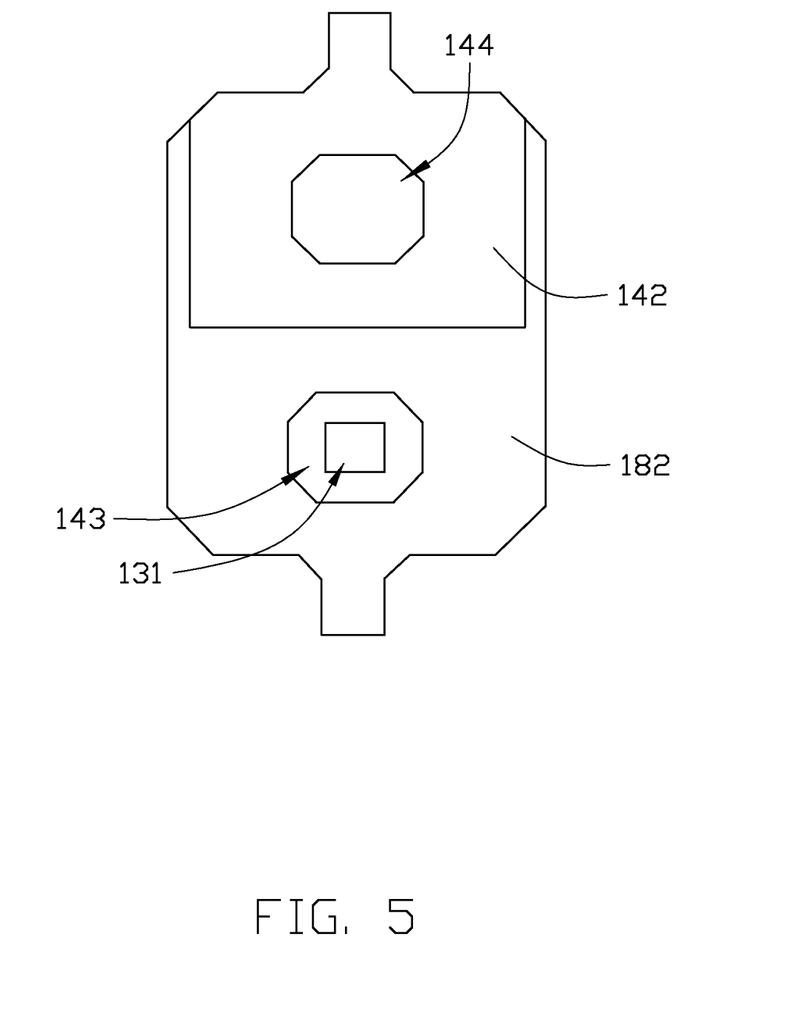
FIG. 5 is a diagrammatic, top view of a second data line and a second lead of the array substrate in FIG. 2.

FIG. 4 to FIG. 5 illustrate that that numbers of the first through hole 131, the second through hole 143 and the third through hole 144 where the first lead 181 is coupled to the first data line 141, are respective more than numbers of the first through 131, the second through hole 143 and the third through hole 144 where the second lead 182 is coupled to the second data line 142. Therefore, contacting area between the first lead 181 and the first coupling part 171 and between the first data line 141 and the first coupling part 171 is larger than contacting area between the second lead 182 and the second coupling part 172 and between the second data line 141 and the second coupling part 172, which realizes the impendences are substantially same to each other when the driving signals are transmitted from the driver 16 to all the data lines 14.

FIG. 4 illustrates that the number of the first through hole 131, the second through hole 143 and the third through hole 144, where the first lead 181 is coupled to the first data line 141 via the first coupling part 171, are three, respectively. FIG. 5 illustrates that the number of the first through hole 131, the second through hole 143 and the third through hole 144, where the second lead 182 is coupled to the second data line 142 via the second coupling part 172, are one, respectively.

Numbers of the first through hole 131, the second through hole 143 and the third through hole 144 are in proportional to the lengths of the leads 18. The longer the lead 18 is, the more the numbers of the first through 131, the second through hole 143 and the third through hole 144 is, to make that the impendences in all the leads 18 are substantially same to each other.

Figure 6:
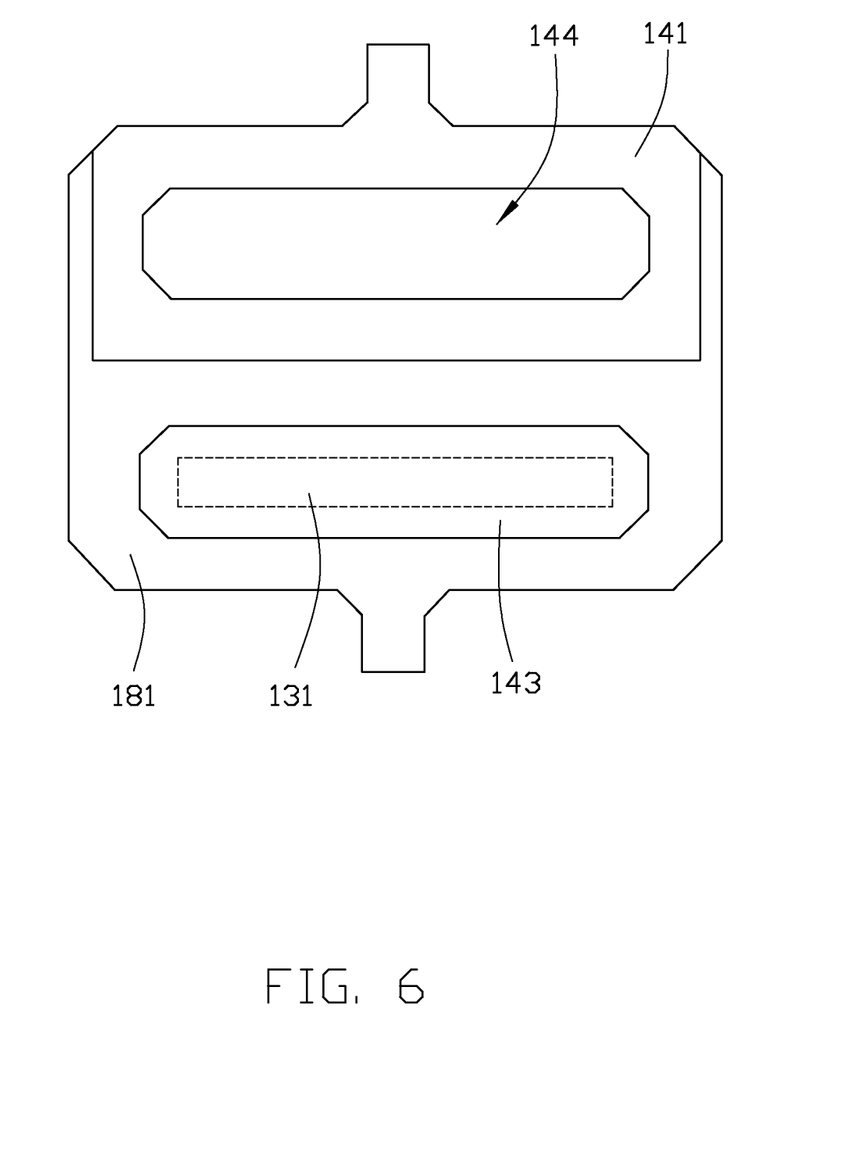
FIG. 6 is a diagrammatic, top view of a first data line and a first lead of an alternative embodiment.
Figure 7:
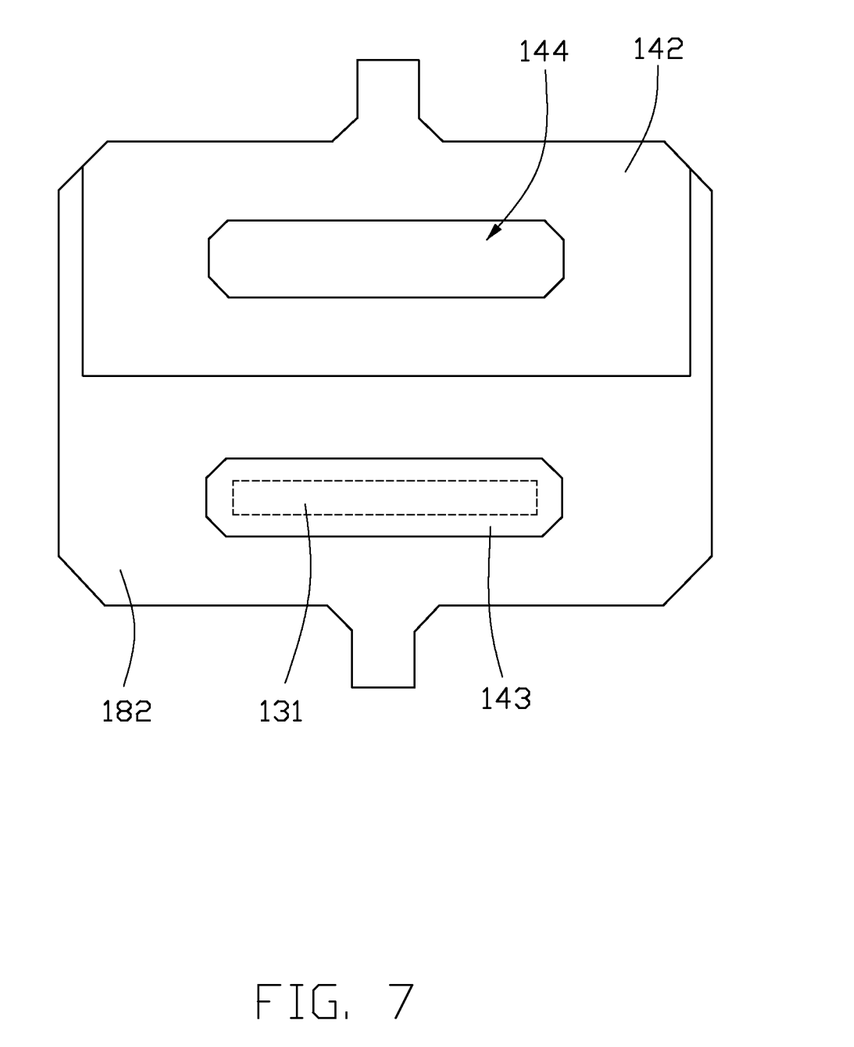
FIG. 7 is a diagrammatic, top view of a second data line and a second lead of an alternative embodiment.

FIG. 6 and FIG. 7 illustrate that sizes of the first through 131, the second through hole 143 and the third through hole 144 where the first lead 181 is coupled to the first data line 141, are respective larger than sizes of the first through 131, the second through hole 143 and the third through hole 144 where the second lead 182 is coupled to the second data line 142.

Therefore, contacting area between the first lead 181 and the first coupling part 171 and between the first data line 141 and the first coupling part 171 is larger than contacting area between the second lead 182 and the second coupling part 172 and between the second data line 141 and the second coupling part 172, which realizes the impendences are substantially same to each other when the driving signals are transmitted from the driver 16 to all the data lines 14.

Sizes of the first through hole 131, the second through hole 143 and the third through hole 144 are in proportional to the lengths of the leads 18. The longer the lead 18 is, the larger the sizes of the first through 131, the second through hole 143 and the third through hole 144 is, to make that the impendences in all the leads 18 are substantially same to each other.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An array substrate comprising:
    a plurality of thin film transistors;
    a plurality of function lines configured to transmit driving signals to the thin film transistors;
    a plurality of leads comprising a first lead and a second lead;
    a plurality of coupling parts, each of the plurality of coupling parts electrically coupling to one of the plurality of function lines by one of the plurality of leads; and
    a driver electrically coupled to the plurality of leads, and configured to provide driving signals to the plurality of function lines;
    wherein the first lead has a length larger than that of the second lead, and a contacting area between the first lead and corresponding one of the plurality of coupling parts is larger than a contacting area between the second lead and corresponding one of the plurality of coupling parts;
    wherein the functions lines comprise a first function line and a second function line; the first function line is coupled to the first lead by corresponding one of the plurality of coupling parts; the second function line is coupled to the second lead by corresponding one of the plurality of coupling parts;
    wherein a contacting area between the first function line and corresponding one of the plurality of coupling parts is larger than a contacting area between the second function line and corresponding one of the plurality of coupling parts;
    wherein the array substrate further comprises a base, a first insulating layer, and a second insulating layer; wherein the plurality of leads is formed on the base; the first insulating layer is formed on the base and covers the plurality of leads; the plurality of function lines is formed on the first insulating layer; the second insulating layer is formed on the first insulating layer and covers the plurality of function lines; the plurality of coupling parts is coupled to the second insulating layer.

2. The array substrate of claim 1, wherein the first insulating layer defines a through hole corresponding to each of the plurality of leads, the second insulating layer defines a second through hole corresponding to the first through hole, each of the plurality of coupling parts has a portion thereof inserted into the first through hole and the second through hole and electrically coupled to one of the plurality of leads.

3. The array substrate of claim 2, wherein the second insulating layer defines a third through hole corresponding to each of the plurality of function lines, each of the plurality of coupling parts has another portion thereof inserted into the third through hole and electrically coupled to one of the plurality of function lines.

4. The array substrate of claim 3, wherein numbers of the first through hole, the second through hole and the third through hole where the first lead is electrically coupled to the first function line, are more than that of first through hole, the second through hole and the third through hole where the second lead is electrically coupled to the second function line.

5. The array substrate of claim 4, wherein the numbers of the first through hole, the second through and the third through are in proportional to the lengths of the leads.

6. The array substrate of claim 3, wherein sizes of the first through hole, the second through hole and the third through hole where the first lead is electrically coupled to the first function line, are larger than that of first through hole, the second through hole and the third through hole where the second lead is electrically coupled to the second function line.

7. The array substrate of claim 6, wherein the sizes of the first through hole, the second through hole and the third through hole are in proportional to the lengths of the leads.

8. The array substrate of claim 1, wherein the function lines are data lines, the driver is a data driver.

9. A display panel comprising an array substrate, an opposite substrate and a liquid crystal layer located between the array substrate and the opposite substrate, the array substrate comprising:
    a plurality of thin film transistors;
    a plurality of function lines configured to transmit driving signals to the thin film transistors;
    a plurality of leads comprising a first lead and a second lead;
    a plurality of coupling parts, each of the plurality of coupling parts electrically coupling to one of the plurality of function lines by one of the plurality of leads; and
    a driver electrically coupled to the plurality of leads, and configured to provide driving signals to the plurality of function lines;
    wherein the first lead has a length larger than that of the second lead, a contacting area between the first lead and corresponding one of the plurality of coupling parts is larger than a contacting area between the second lead and corresponding one of the plurality of coupling parts;
    wherein the functions lines comprise a first function line and a second function line; the first function line is coupled to the first lead by corresponding one of the plurality of coupling parts; the second function line is coupled to the second lead by corresponding one of the plurality of coupling parts;
    wherein a contacting area between the first function line and corresponding one of the plurality of coupling parts is larger than a contacting area between the second function line and corresponding one of the plurality of coupling parts;

wherein the array substrate further comprises a base, a first insulating layer and a second insulating layer; wherein the plurality of leads is formed on the base, the first insulating layer is formed on the base and covers the plurality of leads; the plurality of function lines are formed on the first insulating layer; the second insulating layer is formed on the first insulating layer and covers the plurality of function lines; the plurality of coupling parts is coupled to the second insulating layer.

10. The display panel of claim 9, wherein the first insulating layer defines a through hole corresponding to the plurality of leads, the second insulating layer defines a second through hole corresponding to the first through hole, each of the plurality of coupling parts has a portion thereof inserted into the first through hole and the second through hole and electrically coupled to one of the plurality of leads.

11. The display panel of claim 10, wherein the second insulating layer defines a third through hole corresponding to the plurality of function lines, each of the plurality of coupling parts has another portion thereof inserted into the third through hole and electrically coupled to one of the plurality of function lines.

12. The display panel of claim 11, wherein numbers of the first through hole, the second through hole and the third through hole where the first lead is electrically coupled to the first function line, are more than that of first through hole, the second through hole and the third through hole where the second lead is electrically coupled to the second function line.

13. The display panel of claim 11, wherein sizes of the first through hole, the second through hole and the third through hole where the first lead is electrically coupled to the first function line, are larger than that of first through hole, the second through hole and the third through hole where the second lead is electrically coupled to the second function line.

14. The display panel of claim 9, wherein the function lines are data lines, the driver is a data driver.

15. An array substrate comprising:
a plurality of thin film transistors;
a plurality of function lines, the plurality of function lines configured to transmit driving signals to the thin film transistors;
a plurality of leads, the plurality of leads comprising a first lead and a second lead;
a plurality of coupling parts, each of the plurality of coupling parts electrically coupling to one of the plurality of function lines by one of the plurality of leads; and
a driver electrically coupled to the plurality of leads, and configured to provide driving signals to the plurality of function lines;
wherein the first lead has a length larger than a length of the second lead; and a contacting area between the first lead and corresponding one of the plurality of coupling parts is larger than a contacting area between the second lead and corresponding one of the plurality of coupling parts.

* * * * *